(12) United States Patent
Fujii et al.

(10) Patent No.: US 11,936,096 B2
(45) Date of Patent: Mar. 19, 2024

(54) WIRING SUBSTRATE, ANTENNA MODULE, AND COMMUNICATION DEVICE

(71) Applicant: Murata Manufacturing Co., Ltd., Kyoto (JP)

(72) Inventors: Norikazu Fujii, Kyoto (JP); Michiharu Yokoyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 417 days.

(21) Appl. No.: 17/237,624

(22) Filed: Apr. 22, 2021

(65) Prior Publication Data
US 2021/0242569 A1    Aug. 5, 2021

Related U.S. Application Data

(63) Continuation of application No. PCT/JP2019/039816, filed on Oct. 9, 2019.

(30) Foreign Application Priority Data

Oct. 31, 2018   (JP) .................................. 2018-204613

(51) Int. Cl.
*H01Q 1/22* (2006.01)
*H01Q 1/52* (2006.01)
*H05K 1/02* (2006.01)

(52) U.S. Cl.
CPC ............. *H01Q 1/2283* (2013.01); *H01Q 1/52* (2013.01); *H05K 1/0237* (2013.01)

(58) Field of Classification Search
CPC ............................... H01Q 1/52; H01Q 1/2283
See application file for complete search history.

(56) References Cited

U.S. PATENT DOCUMENTS

| 4,560,962 A | 12/1985 | Barrow |
| 6,326,920 B1 | 12/2001 | Barnett et al. |

(Continued)

FOREIGN PATENT DOCUMENTS

| CN | 104078766 A | 10/2014 |
| CN | 107785655 A | 3/2018 |

(Continued)

OTHER PUBLICATIONS

International Search Report for International Application No. PCT/JP2019/039816 dated Nov. 26, 2019.

(Continued)

*Primary Examiner* — Graham P Smith
(74) *Attorney, Agent, or Firm* — Pearne & Gordon LLP

(57) ABSTRACT

A wiring substrate for supplying a radio frequency signal to an antenna module having a first antenna element and a second antenna element includes a dielectric substrate having a laminated structure, a first power supply wiring that is formed in the dielectric substrate and supplies a radio frequency signal to the first antenna element, a second power supply wiring that is formed in the dielectric substrate and supplies a radio frequency signal to the second antenna element, and a ground conductor that is formed in a layer different from any one of a layer in which the first power supply wiring is formed and a layer in which the second power supply wiring is formed, and in which a hole portion is formed in a portion between the first power supply wiring and the second power supply wiring of the dielectric substrate toward the ground conductor.

18 Claims, 9 Drawing Sheets

(56) References Cited

U.S. PATENT DOCUMENTS

| | | | |
|---|---|---|---|
| 2009/0153433 A1* | 6/2009 | Nagai | ............... H01Q 15/006 343/893 |
| 2010/0025085 A1 | 2/2010 | Torigoshi et al. | |
| 2014/0292606 A1 | 10/2014 | Hayakawa et al. | |
| 2015/0207221 A1 | 7/2015 | Iso et al. | |
| 2018/0062263 A1 | 3/2018 | Ueda | |

FOREIGN PATENT DOCUMENTS

| | | |
|---|---|---|
| JP | H06-120711 A | 4/1994 |
| JP | H08-237007 A | 9/1996 |
| JP | 3725796 B2 | 12/2005 |
| JP | 2006-165779 A | 6/2006 |
| JP | 2007-166115 A | 6/2007 |
| JP | 2009-005104 A | 1/2009 |
| JP | 2010-040547 A | 2/2010 |
| JP | 2014-197811 A | 10/2014 |
| JP | 2015-139051 A | 7/2015 |
| JP | 2016-86260 A | 5/2016 |

OTHER PUBLICATIONS

Written Opinion for International Application No. PCT/JP2019/039816 dated Nov. 26, 2019.

* cited by examiner

WIRING SUBSTRATE, ANTENNA MODULE, AND COMMUNICATION DEVICE

CROSS REFERENCE TO RELATED APPLICATIONS

This is a continuation of International Application No. PCT/JP2019/039816 filed on Oct. 9, 2019 which claims priority from Japanese Patent Application No. 2018-204613 filed on Oct. 31, 2018. The contents of these applications are incorporated herein by reference in their entireties.

BACKGROUND OF THE DISCLOSURE

Field of the Disclosure

The present disclosure relates to a wiring substrate, an antenna module, and a communication device.

Description of the Related Art

An existing antenna module having two antenna elements and two power supply wirings for supplying a radio frequency signal to each of the two antenna elements has been proposed (for example, Patent Document 1).
Patent Document 1: Japanese Patent No. 3725796

BRIEF SUMMARY OF THE DISCLOSURE

In an antenna module described in Patent Document 1, there is a case where two power supply wirings that supply a radio frequency signal are electromagnetically coupled to each other. When the two power supply wirings are coupled to each other, the isolation between the two antenna elements is reduced.

The present disclosure has been made to solve the above-described problem, and an object of the present disclosure is to improve the isolation between antenna elements for a wiring substrate used in an antenna module having a plurality of antenna elements.

A wiring substrate for supplying a radio frequency signal to an antenna module having a first antenna element and a second antenna element includes a dielectric substrate having a laminated structure, a first power supply wiring formed in the dielectric substrate and configured to supply a radio frequency signal to the first antenna element, a second power supply wiring formed in the dielectric substrate and configured to supply a radio frequency signal to the second antenna element, and a ground conductor formed in a layer that is different from any of a layer in which the first power supply wiring is formed and a layer in which the second power supply wiring is formed, in which a hole portion is formed in the dielectric substrate from between the first power supply wiring and the second power supply wiring toward the ground conductor.

According to the present disclosure, it is possible to improve the isolation between antenna elements for a wiring substrate used in an antenna module having a plurality of antenna elements.

DETAILED DESCRIPTION OF THE DISCLOSURE

Figure 1:
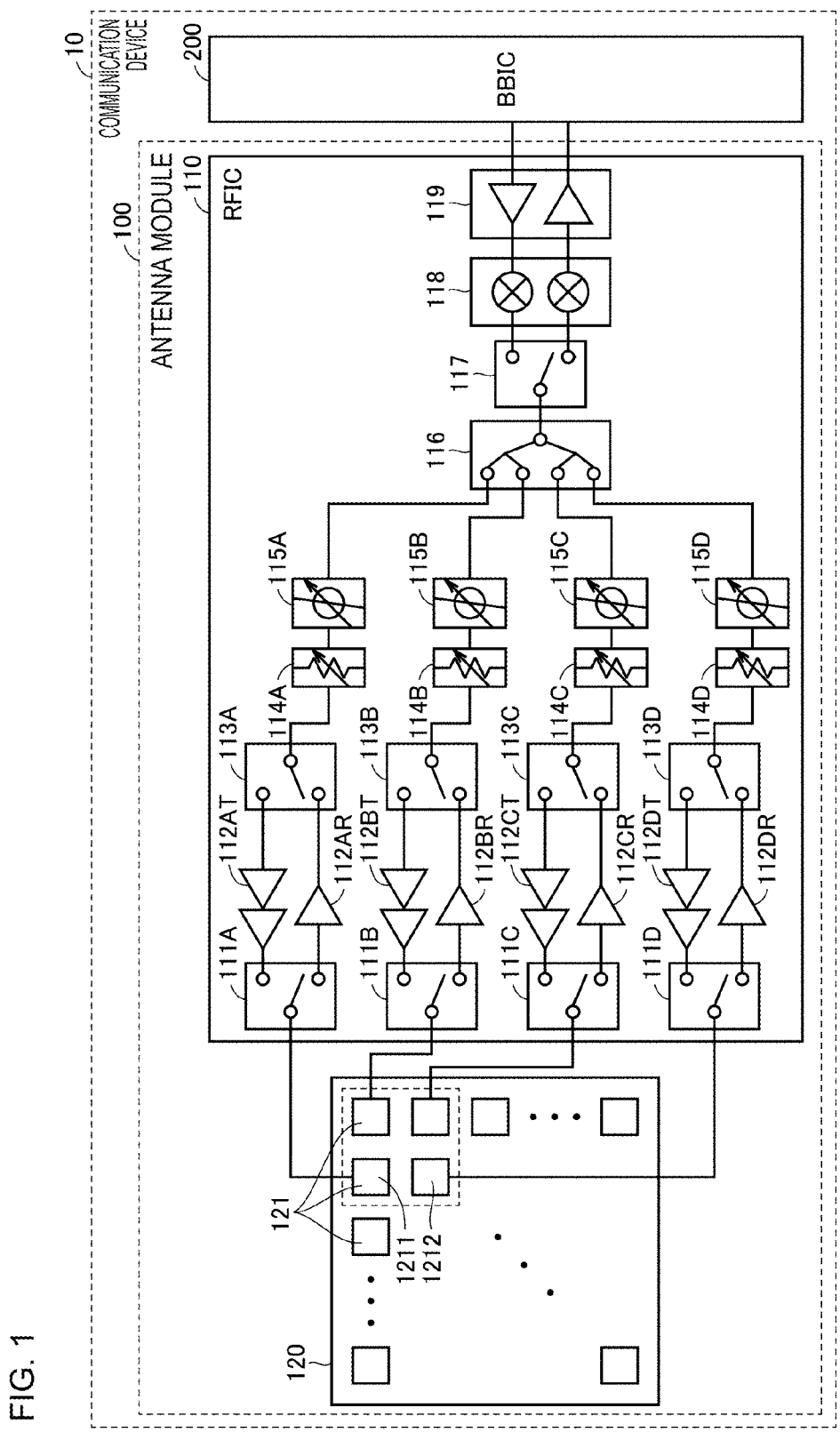
FIG. 1 is a block diagram of a communication device to which an antenna module according to a first embodiment is applied.

Hereinafter, embodiments of the present disclosure will be described in detail with reference to the drawings. Note that the same or corresponding parts in the drawings are denoted by the same reference numerals, and the description thereof will not be repeated.

First Embodiment (Basic Configuration of Communication Device)
FIG. 1 is a block diagram illustrating an example of a communication device 10 to which an antenna module 100 according to the embodiment is applied. The communication device 10 is, for example, a mobile terminal such as a mobile phone, a smartphone, or a tablet, a personal computer having a communication function, or the like. An example of a frequency band of a radio wave used in the antenna module 100 according to the embodiment includes radio waves in a millimeter wave band having 28 GHz, 39 GHz, and 60 GHz as the center frequencies, radio waves in the frequency bands other than those described above can also be applied.

Referring to FIG. 1, the communication device 10 includes the antenna module 100 and a BBIC 200 that configures a baseband signal processing circuit. The antenna module 100 includes a radio frequency integrated circuit (RFIC) 110, which is an example of a radio frequency circuit, and an antenna array 120. The communication device 10 up-converts a signal transmitted from the BBIC 200 to the antenna module 100 into a radio frequency signal, radiates the signal from the antenna array 120, and down-converts the radio frequency signal received by the antenna array 120 to perform the signal processing in the BBIC 200.

Note that, in FIG. 1, for ease of explanation, only a configuration corresponding to four antenna elements (radiation elements) 121 among the plurality of antenna elements 121 configuring the antenna array 120 is illustrated, and a configuration corresponding to the other antenna elements 121 having the same configuration is omitted. Further, the antenna element 121 includes a first antenna element 1211 and a second antenna element 1212.

A RFIC 110 includes switches 111A to 111D, 113A to 113D, and 117, power amplifiers 112AT to 112DT, low-noise amplifiers 112AR to 112DR, attenuators 114A to 114D, phase shifters 115A to 115D, a signal combiner/demultiplexer 116, a mixer 118, and an amplifier circuit 119.

In a case where the radio frequency signal is transmitted, the switches 111A to 111D and 113A to 113D are switched to the power amplifiers 112AT to 112DT sides, and the switch 117 is connected to a transmission-side amplifier of the amplifier circuit 119. In a case where the radio frequency signal is received, the switches 111A to 111D and 113A to 113D are switched to the low-noise amplifiers 112AR to 112DR sides, and the switch 117 is connected to a reception-side amplifier of the amplifier circuit 119.

The signal transmitted from the BBIC 200 is amplified by the amplifier circuit 119, and is up-converted by the mixer 118. A transmission signal, which is an up-converted radio frequency signal, is branched into four signals by the signal combiner/demultiplexer 116, and the four-branched transmission signals are supplied to the respective different antenna elements 121 by passing through the four signal paths. At this time, the directivity of the antenna array 120 can be adjusted by individually adjusting the degrees of phase shift of the phase shifters 115A to 115D arranged in the respective signal paths.

Further, the received signals that are the radio frequency signals received by the respective antenna elements 121 pass through four different signal paths respectively and are multiplexed by the signal combiner/demultiplexer 116. The combined received signals are down-converted by the mixer 118, amplified by the amplifier circuit 119, and transmitted to the BBIC 200.

The RFIC 110 is formed as a one chip integrated circuit component including, for example, the above-described circuit configuration. Alternatively, the devices (switches, power amplifiers, low-noise amplifiers, attenuators, and phase shifters) corresponding to the respective antenna elements 121 in the RFIC 110 may be formed as a one chip integrated circuit component for each of the corresponding antenna elements 121.

(Structure of Wiring Substrate)

Figure 2:
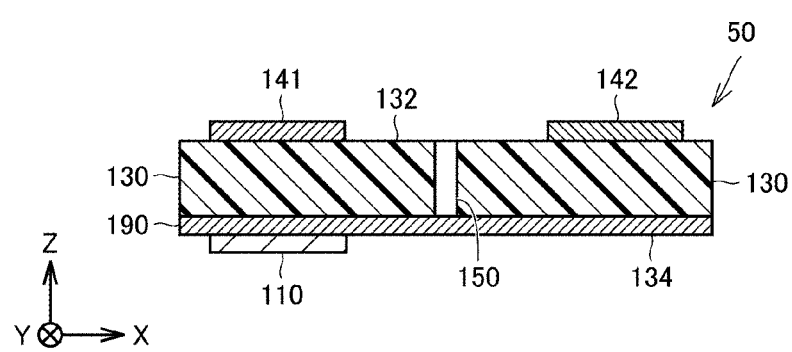
FIG. 2 is a cross-sectional view of a wiring substrate according to the first embodiment.

FIG. 2 is a cross-sectional view of a wiring substrate 50 according to a first embodiment. A structure of the wiring substrate 50 according to the first embodiment will be described using FIG. 2. Note that, in FIG. 1, the wiring substrate 50 corresponds to a portion including a power supply wiring connected to each antenna element 121 from the RFIC 110.

The wiring substrate 50 includes a first power supply wiring 141, a second power supply wiring 142, a dielectric substrate 130, and a ground conductor 190.

The dielectric substrate 130 has a laminated structure. Typically, the dielectric substrate 130 is a substrate in which resin is formed in a multilayer structure.

In the drawings of the embodiment, an axis in a lamination direction in the laminated structure of the dielectric substrate 130 is defined as a Z-axis. Further, an axis orthogonal to the Z-axis is defined as an X-axis and a Y-axis. In the following, a length in a Z-axis direction may be referred to as a "thickness" in some cases.

The dielectric substrate 130 includes a first main surface 132 and a second main surface 134 that is a surface opposite to the first main surface 132. On the first main surface 132, the first power supply wiring 141 and the second power supply wiring 142 are arranged. Both the first power supply wiring 141 and the second power supply wiring 142 extend in a Y-axis direction. The first power supply wiring 141 is connected to the first antenna element 1211. The second power supply wiring 142 is connected to the second antenna element 1212.

Figure 8:
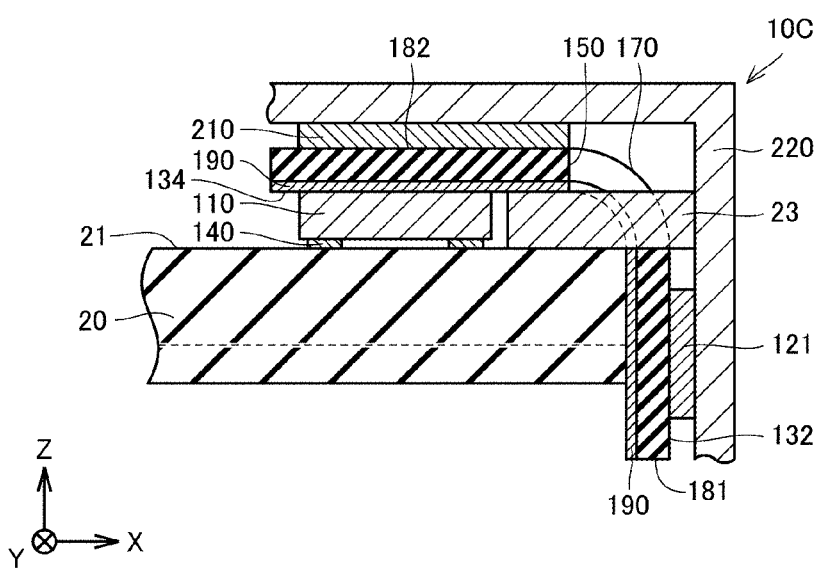
FIG. 8 is a cross-sectional view of a part of a communication device according to the fourth embodiment.

The RFIC 110 is mounted on the second main surface 134 (mounting surface) of the dielectric substrate 130 via a connection electrode such as a solder bump (solder bump 140 in FIG. 8). The first power supply wiring 141 supplies a radio frequency signal from the RFIC 110 to the first antenna element 1211. The second power supply wiring 142 supplies a radio frequency signal from the RFIC 110 to the second antenna element 1212.

The ground conductor 190 is formed in a layer that is different from any of a layer in which the first power supply wiring 141 is formed and a layer in which the second power supply wiring 142 is formed. In the example of FIG. 2, the ground conductor 190 is arranged on the second main surface 134 side in the dielectric substrate 130.

The dielectric substrate 130 has a hole portion 150 formed therein. Typically, the hole portion 150 is formed along the Z-axis direction from the first main surface 132 until the hole portion 150 reaches the ground conductor 190 between the first power supply wiring 141 and the second power supply wiring 142 of the dielectric substrate 130.

Also, a material of the conductor (via, electrode, antenna element, and the like) is typically a metal including Al, Cu, Au, Ag, or an alloy of at least two of these metals as a main component.

Further, the dielectric substrate 130 formed in a multilayer structure may be a low temperature co-fired ceramics (LTCC) multilayer substrate. In addition, the dielectric substrate 130 may be a multilayer resin substrate formed by laminating a plurality of resin layers made of resin such as epoxy, polyimide, or the like. Alternatively, the dielectric substrate 130 may be a multilayer resin substrate formed by laminating a plurality of resin layers each made of a liquid crystal polymer (LCP) having a lower dielectric constant. In addition, the dielectric substrate 130 may be a multilayer resin substrate formed by laminating a plurality of resin layers made of a fluorine-based resin. In addition, the dielectric substrate 130 may be a ceramic multilayer substrate having a higher firing temperature than the above-described low temperature co-fired ceramics multilayer substrate.

Figure 3:
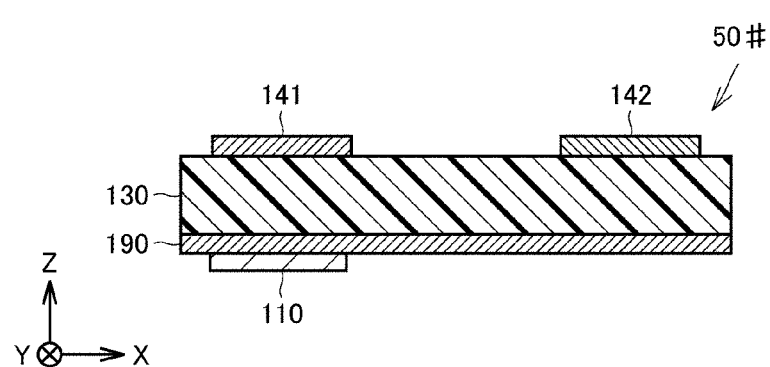
FIG. 3 is a cross-sectional view of a wiring substrate according to a comparative example.

FIG. 3 is a cross-sectional view of a wiring substrate 50# according to a comparative example. In the wiring substrate 50#, the hole portion 150 is not provided in the dielectric substrate 130. When the radio frequency signal is propagated to the first power supply wiring 141 and the second power supply wiring 142, the electromagnetic waves are radiated from the first power supply wiring 141 and the second power supply wiring 142. The radiated electromagnetic waves include electric lines of force and magnetic lines of force. The electric lines of force are distributed from the first power supply wiring 141 toward the ground conductor 190, and are distributed from the second power supply wiring 142 toward the ground conductor 190. Further, when a phase of the radio frequency signal is an opposite phase, the electric lines of force are distributed toward the opposite direction. The direction of the electric lines of force depends on the dielectric constant of the dielectric substrate, and therefore, the electric lines of force are directed toward a region having a high dielectric constant between the first power supply wiring 141 and the ground conductor 190 and between the second power supply wiring 142 and the ground conductor 190. In a case where the dielectric constant of the dielectric substrate 130 between the first power supply wiring 141 and the second power supply wiring 142 and the ground conductor 190 is uniform, the electric lines of force between the first power supply wiring 141 and the ground conductor 190 and the electric lines of force between the second power supply wiring 142 and the ground conductor 190 are likely to be electromagnetically coupled to each other between the first power supply wiring 141 and the second power supply wiring 142. As a result, there may be a case where the isolation between the first power supply wiring 141 and the second power supply wiring 142, i.e., between the antenna element connected to the first power supply wiring 141 and the antenna element connected to the second power supply wiring 142 is reduced.

In view of this, in the embodiment, in the wiring substrate 50 illustrated in FIG. 2, the hole portion 150 is formed in the dielectric substrate 130 from between the first power supply wiring 141 and the second power supply wiring 142 toward the ground conductor 190. As such, the dielectric layer between the first power supply wiring 141 and the second power supply wiring 142 can be provided with a gap having a dielectric constant lower than the dielectric constant of the material of the dielectric substrate 130. Therefore, it is possible to reduce the potential coupling of the electric lines of force between the first power supply wiring 141 and the ground conductor 190 with the electric lines of force between the second power supply wiring 142 and the ground conductor 190 between the first power supply wiring 141 and the second power supply wiring 142. As a result, it is possible to improve the isolation between the first antenna element 1211 and the second antenna element 1212.

Note that the hole portion 150 may have a configuration in which it does not reach the ground conductor 190 from between the first power supply wiring 141 and the second power supply wiring 142. With the configuration, the hole portion 150 shallower than the hole portion 150 illustrated in FIG. 2 can reduce the number of steps (manufacturing cost) of formation processing of the hole portion 150. On the other hand, when the hole portion 150 has a deep configuration (for example, as illustrated in FIG. 2, a configuration in which the hole portion 150 reaches the ground conductor 190), the degree of improvement in the isolation between the first antenna element 1211 and the second antenna element 1212 can be increased. That is, the degree of improvement in the isolation between the first antenna element 1211 and the second antenna element 1212 and the burden on the formation processing of the hole portion 150 are in a trade-off relationship. Therefore, a designer or the like of the wiring substrate 50 determines the depth of the hole portion 150 in consideration of the degree of improvement in the isolation and the burden on the formation processing of the hole portion 150.

Second Embodiment

Figure 4:
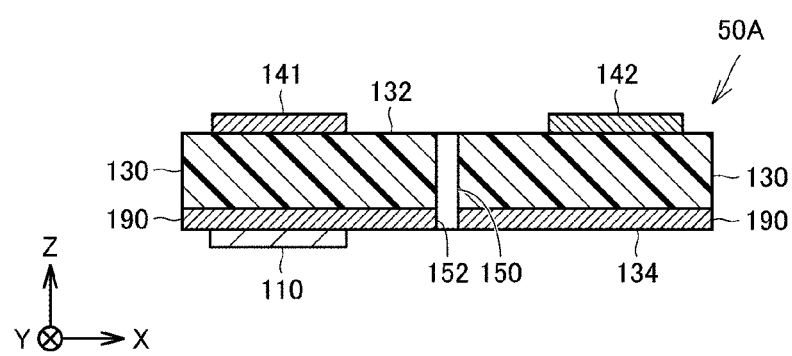
FIG. 4 is a cross-sectional view of a wiring substrate according to a second embodiment.

FIG. 4 is a cross-sectional view of a wiring substrate 50A according to a second embodiment. As illustrated in FIG. 4, in the wiring substrate 50A, a through-hole portion 152 communicating with the hole portion 150 is formed in the ground conductor 190.

The electric lines of force of the electromagnetic wave radiated by one of the first power supply wiring 141 and the second power supply wiring 142 may affect the other power supply wiring even through the ground conductor 190. Therefore, by forming the through-hole portion 152 in the ground conductor 190, it is possible to further suppress the electromagnetic field coupling via the ground conductor 190.

According to the wiring substrate 50A of the second embodiment, as compared to the wiring substrate 50 of the first embodiment in which the through-hole portion 152 is not formed in the ground conductor 190, it is possible to reduce the isolation between a portion of the ground conductor 190 that is located in the lamination direction of the first power supply wiring 141 and a portion thereof that is located in the lamination direction of the second power supply wiring 142. Therefore, it is possible to further improve the isolation between the first antenna element 1211 and the second antenna element 1212 as compared to the wiring substrate 50 according to the first embodiment.

Third Embodiment

Figure 5:
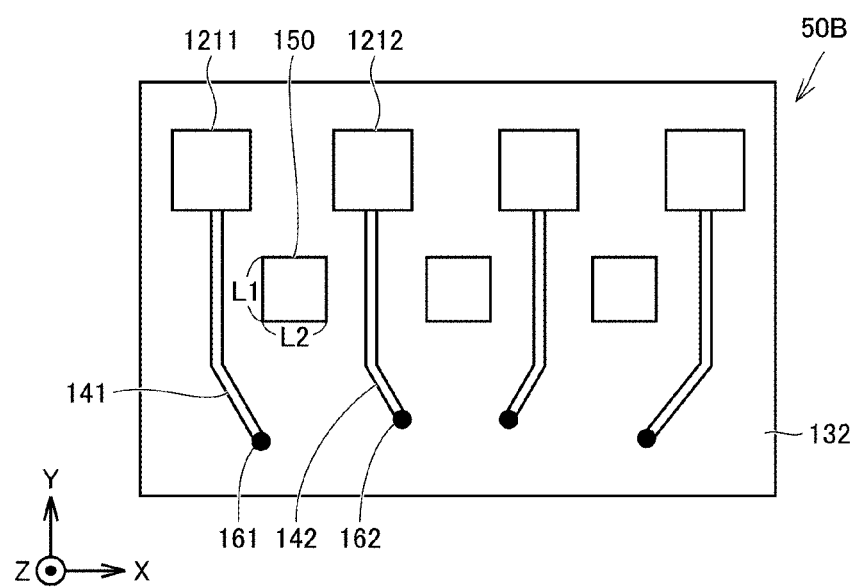
FIG. 5 is a plan view of a wiring substrate according to a third embodiment.

In the wiring substrate according to a third embodiment, a preferred dimension of the hole portion 150 is determined. FIG. 5 is a diagram illustrating an example of a wiring substrate 50B according to the third embodiment. FIG. 5 is a view when the first main surface 132 of the wiring substrate 50B is viewed in a plan view. Referring to FIG. 5, one end of the first power supply wiring 141 is electrically connected to a via 161, and the other end of the first power supply wiring 141 is electrically connected to the first antenna element 1211. Further, one end of the second power supply wiring 142 is electrically connected to a via 162, and the other end of the second power supply wiring 142 is electrically connected to the second antenna element 1212. The hole portion 150 is formed between the first power supply wiring 141 and the second power supply wiring 142. In the example of FIG. 5, the first antenna element 1211, the second antenna element 1212, the first power supply wiring 141, and the second power supply wiring 142 are each formed on the same plane (on the first main surface 132).

From the first antenna element 1211 and the second antenna element 1212 of the embodiment, radio waves of a polarized wave whose excitation direction is the Y-axis direction are radiated.

Note that as a modified example, a power supply position to the first antenna element 1211 and the second antenna element 1212 is not limited to an end portion, and may be an inner side from the end portion. Further, the first power supply wiring 141 and the second power supply wiring 142 may be provided inside the dielectric substrate 130, the first antenna element 1211 and the first power supply wiring 141 may be connected by a via, and the second antenna element 1212 and the second power supply wiring 142 may be connected by a via. In the case or the like where such a configuration is employed, the first antenna element 1211 and the second antenna element 1212 may radiate radio waves of a polarized wave whose excitation direction is an X-axis direction.

In addition, when the first main surface 132 is viewed in a plan view, the shape of the hole portion 150 is a rectangular shape. In a plane along the first main surface 132, a length of the hole portion 150 in an extending direction (Y-axis direction) of the first power supply wiring 141 is defined as a first length L1. In addition, in a plane along the first main surface 132, a length of the hole portion 150 in a direction (X-axis direction) orthogonal to the extending direction of the first power supply wiring 141 is defined as a second length L2.

A wave length of a radio frequency signal flowing through the first power supply wiring 141 (i.e., a radio frequency signal supplied by the first power supply wiring 141) is defined as $\lambda$. Here, when the first length L1 is equal to or more than $\lambda/2$ (L1$\geq\lambda/2$), the wiring substrate 50B may function as a slot antenna.

In this case, the radio waves outputted from the first antenna element 1211 and the second antenna element 1212 interfere with the radio waves generated by the slot antenna, and as a result, it may become impossible to obtain the desired antenna characteristics. Such interference of the radio waves occurs similarly even when the second length L2 becomes equal to or more than $\lambda/2$.

Therefore, in the embodiment, at least one of the first length L1 and the second length L2 of the hole portion 150 is less than $\lambda/2$ (satisfying at least one of L1$<\lambda/2$ and L2$<\lambda/2$). This prevents the wiring substrate 50B from functioning as the slot antenna. As a result, it is possible to prevent the radio waves from the first antenna element 1211 and the second antenna element 1212 and the radio waves from the slot antenna from interfering with each other.

Note that as a modified example of the third embodiment, the first antenna element 1211 and the second antenna element 1212 may be configured to radiate both the radio wave of the polarized wave whose excitation direction is the Y-axis direction and the radio wave of the polarized wave whose excitation direction is the X-axis direction. In the case of this configuration, it is possible to suppress that the wiring substrate 50B functions as a slot antenna by setting L1$<\lambda/2$ and L2$<\lambda/2$.

In this way, it is preferable to determine the side of the hole portion 150 so that the radio waves from the first antenna element 1211 and the second antenna element 1212 do not interfere with the radio waves from the wiring substrate 50B in accordance with a polarization direction of the radio waves radiated from the first antenna element 1211 and the second antenna element 1212 (the antenna element).

As described above, it is preferable that at least one of the first length L1 and the second length L2 of the hole portion 150 be less than $\lambda/2$.

Note that the radio frequency signal flowing through the first power supply wiring 141 and the radio frequency signal flowing through the second power supply wiring 142 do not have to be completely identical to each other in frequency, and may be different from each other in frequency. The radio frequency signal flowing through the first power supply wiring 141 and the radio frequency signal flowing through the second power supply wiring 142 may have different frequencies from each other in a band width of 3 GHz with the center frequency of 28 GHz, for example.

Fourth Embodiment

In a fourth embodiment, a wiring substrate having a configuration in which a bent portion is included, and further the hole portion 150 is formed in the bent portion will be described.

Figure 6:
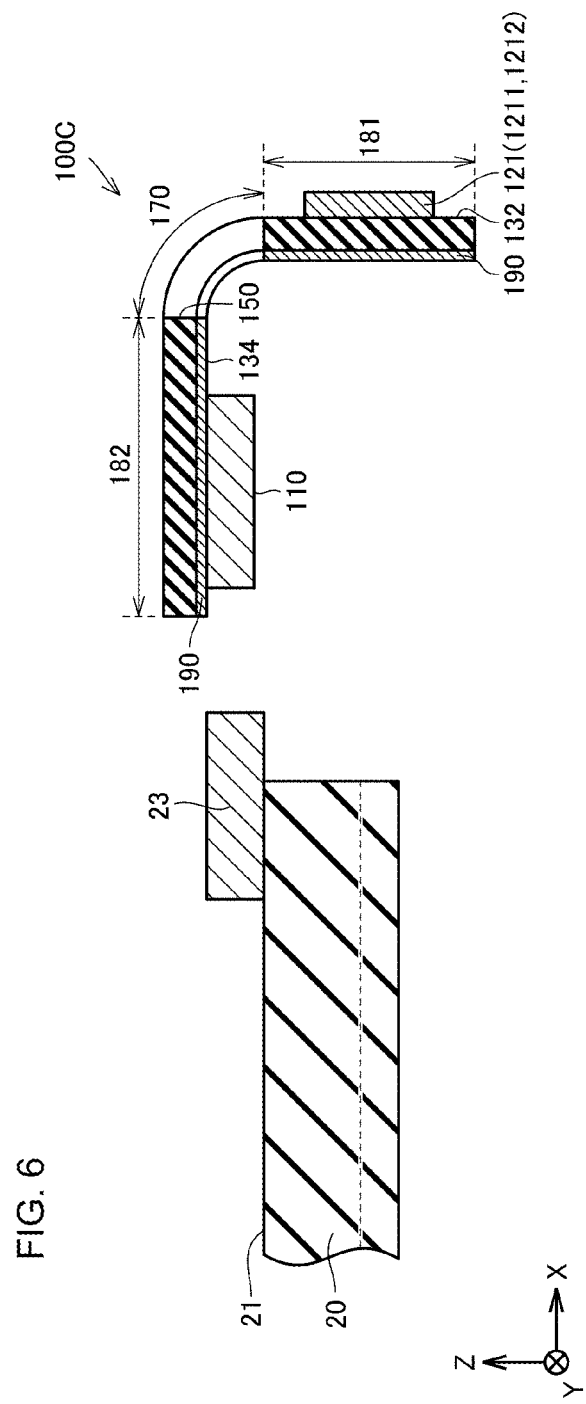
FIG. 6 is a cross-sectional view of a wiring substrate and a mounting substrate according to a fourth embodiment.
Figure 7:
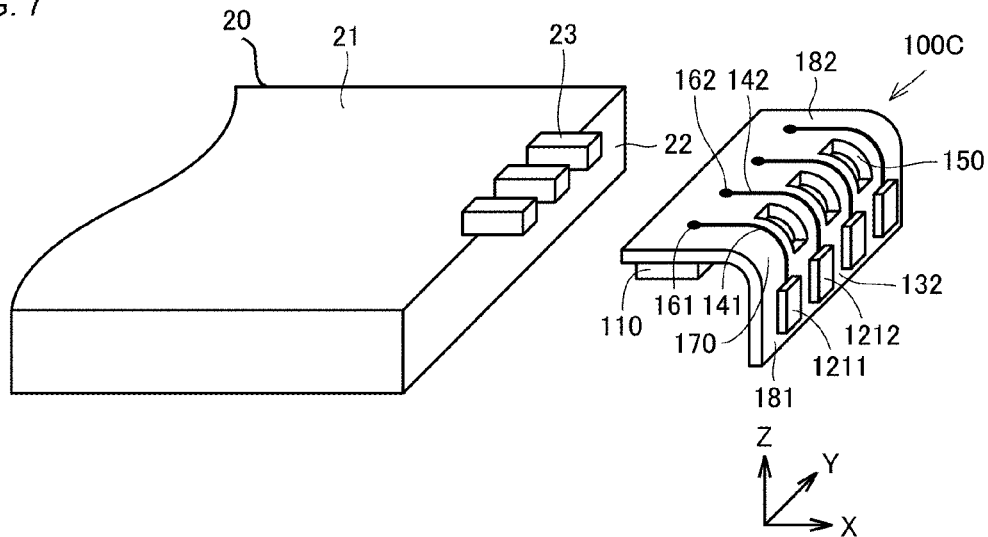
FIG. 7 is a perspective view of the wiring substrate and the mounting substrate according to the fourth embodiment.
Figure 9:
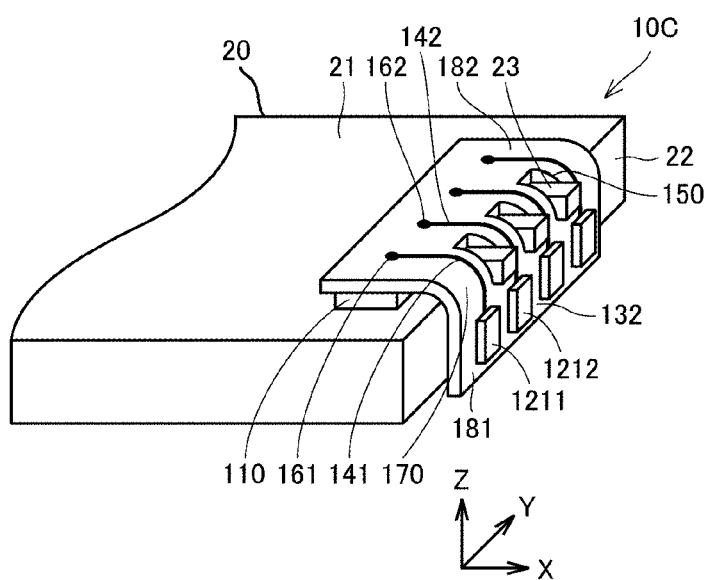
FIG. 9 is a perspective view of a part of the communication device according to the fourth embodiment.

FIG. 6 to FIG. 9 are diagrams for describing the wiring substrate according to the fourth embodiment, an antenna module 100C including the wiring substrate, and a communication device 10C including the antenna module 100C. FIG. 6 is an exploded cross-sectional view of the communication device 10C, and FIG. 7 is an exploded perspective view of the communication device 10C. FIG. 8 is a cross-sectional view of a part of the communication device 10C, and FIG. 9 is a perspective view of a part of the communication device 10C. Note that, in FIG. 6, FIG. 7, and FIG. 9, a housing 220 illustrated in FIG. 8 is omitted.

The dielectric substrate 130 and the ground conductor 190 of the wiring substrate of the fourth embodiment are, as an example, flexible substrates having flexibility. Accordingly, the wiring substrate can be bent by a manual operation of an operator or a manufacturing device or the like, and a bent portion 170 is formed on the wiring substrate. Note that as a modified example, the dielectric substrate 130 and the ground conductor 190 of the wiring substrate may be made of a material that does not have flexibility.

The wiring substrate includes a first flat portion 181 extending from one end of the bent portion 170, and a second flat portion 182 extending from the other end of the bent portion 170.

The antenna element 121 including the first antenna element 1211 and the second antenna element 1212 is formed on the first main surface 132 of the first flat portion 181. Further, the RFIC 110 is mounted on the second main surface 134 of the second flat portion 182.

The plurality of hole portions 150 is formed in the bent portion 170. Before the wiring substrate is bent, it is desirable that a portion (a portion between the first flat portion 181 and the second flat portion 182) in which the plurality of hole portions 150 is formed have lower rigidity than the first flat portion 181 and the second flat portion 182 in which the plurality of hole portions 150 is not formed. Therefore, the wiring substrate can be bent easier when the wiring substrate is bent at the portion in which the plurality of hole portions 150 is formed than when the wiring substrate is bent at the first flat portion 181 and the second flat portion 182.

Next, a mounting substrate 20 will be described. The mounting substrate 20 has a main surface 21 and a side surface 22. On the main surface 21, a plurality of convex portions 23 is formed. The convex portion 23 may be formed integrally with the mounting substrate 20. Further, the convex portion 23 may be formed separately from the mounting substrate 20.

As an example, the number of the convex portions 23 is equal to the number of the hole portions 150. In the example of FIG. 7, the number of hole portions 150 and the number of convex portions 23 are both "three". The three convex portions 23 are inserted into the three hole portions 150, respectively.

In the step of attaching the wiring substrate to the mounting substrate 20, the hole portion 150 is used for positioning the wiring substrate on the mounting substrate 20 by the operator or the like.

Next, the communication device 10C in which the antenna module 100C is attached to the mounting substrate 20 will be described with reference to FIG. 8 and FIG. 9.

Referring to FIG. 8, the RFIC 110 is arranged on the main surface 21 of the mounting substrate 20 with the solder bump 140 interposed therebetween. As described above, the RFIC 110 is provided on the second main surface 134 of the second flat portion 182. Note that, the mounting of the antenna module 100C with respect to the mounting substrate 20 may be realized by a connector (not illustrated).

Further, the RFIC 110 and the respective first power supply wiring 141 and the second power supply wiring 142 are electrically connected to each other by a via or the like inside the dielectric layer in the second flat portion 182.

As illustrated in FIG. 8, the antenna module 100C is further arranged in the housing 220. In the example of FIG. 8, the antenna module 100C is attached to the housing 220 with an adhesive layer 210 interposed therebetween.

According to the wiring substrate of the fourth embodiment, the hole portion 150 is used for positioning on the mounting substrate 20 to which the wiring substrate is attached. Therefore, in the mounting process of the wiring substrate on the mounting substrate 20, the operator or the like can easily attach the wiring substrate (antenna module) to the mounting substrate 20.

Further, the hole portion 150 is formed in the bent portion 170 of the wiring substrate. Accordingly, the wiring substrate in which the hole portion 150 is formed may function as a slot antenna. However, even when the wiring substrate functions as a slot antenna, the radio waves radiated from the hole portion 150 are radiated in a normal direction of the bent portion in which the hole portion 150 is formed, and are therefore radiated in a direction between the X-axis direction and the Z-axis direction. On the other hand, the radio waves radiated from the antenna element 121 are radiated in the X-axis direction. Therefore, even when the wiring substrate functions as the slot antenna, it is possible to prevent the radio waves from the antenna element from interfering with the radio waves radiated from the hole portion 150.

Fifth Embodiment

In the fourth embodiment, the wiring substrate having the configuration in which the hole portion 150 is formed in the bent portion 170 and is not formed in both of the first flat portion 181 and the second flat portion 182 has been described. In a fifth embodiment, a wiring substrate having a configuration in which the hole portion 150 is formed in the bent portion 170 and is formed over at least one of the first flat portion 181 and the second flat portion 182 will be described.

Figure 10:
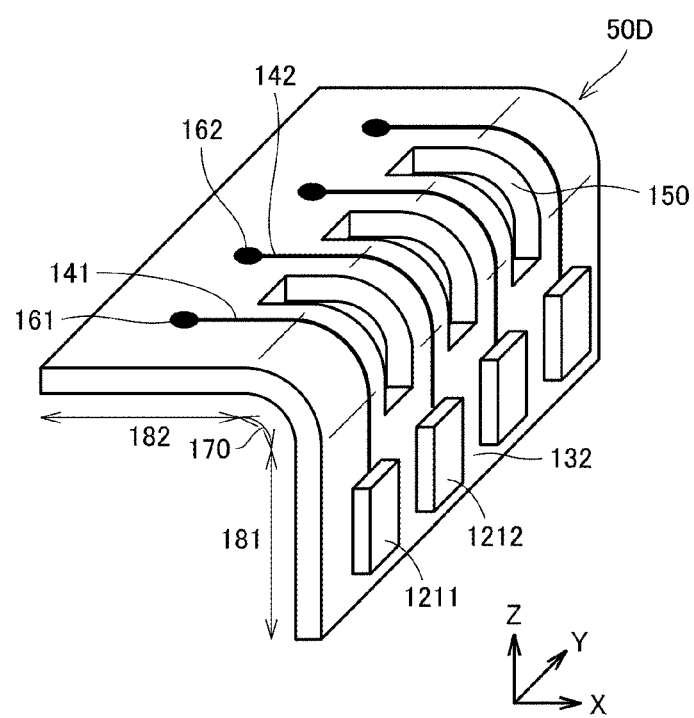
FIG. 10 is a perspective view of a wiring substrate according to a fifth embodiment.

FIG. 10 is a perspective view of a wiring substrate 50D according to the fifth embodiment. The wiring substrate 50D in the example of FIG. 10 has the first flat portion 181 and the second flat portion 182 at both ends of the bent portion 170. In the wiring substrate 50D illustrated in FIG. 10, the hole portion 150 is formed not only in the bent portion 170 but also over the first flat portion 181 and the second flat portion 182. Note that, in FIG. 10 and FIG. 11, which will be described later, lines crossing the power supply wiring are described in the power supply wiring such as the first power supply wiring 141 and the second power supply wiring 142. These lines are lines for clarifying a separation between the first flat portion 181 and the bent portion 170 and a separation between the second flat portion 182 and the bent portion 170, and actually, such lines do not exist.

According to the wiring substrate 50D of the fifth embodiment, it is possible to provide more portions having low rigidity as compared to the wiring substrate in which the hole portion is formed only in the bent portion 170. Therefore, the wiring substrate 50D according to the fifth embodiment further can be bent easier than the wiring substrate in which the hole portions are formed only in the bent portion 170.

Note that the hole portion 150 may be formed to extend only from the bent portion 170 to the first flat portion 181. Alternatively, the hole portion 150 may be formed to extend only from the bent portion 170 to the second flat portion 182. That is, the hole portion 150 may be formed over at least one of the first flat portion 181 and the second flat portion 182 and the bent portion 170.

Sixth Embodiment

Figure 11:
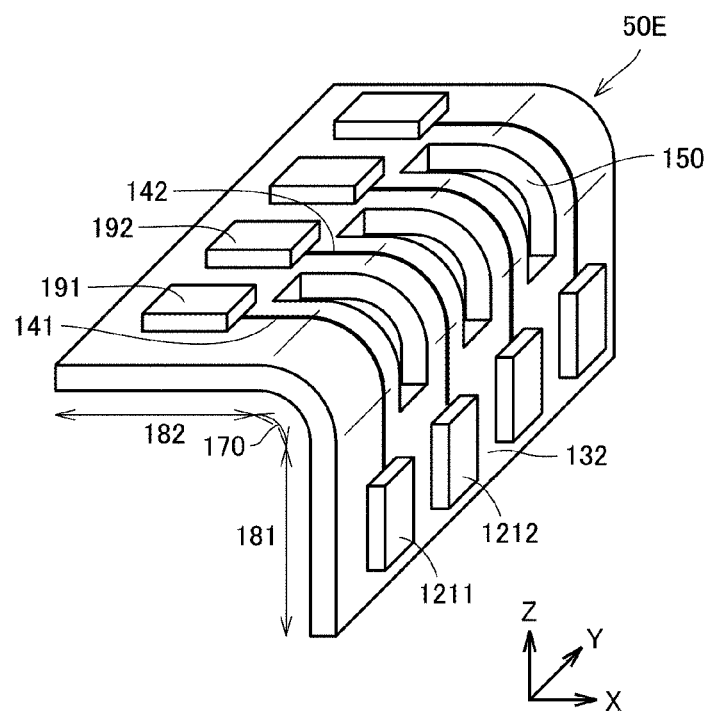
FIG. 11 is a perspective view of a wiring substrate according to a sixth embodiment.

FIG. 11 is a perspective view of a wiring substrate 50E according to a sixth embodiment. As illustrated in FIG. 11, in the wiring substrate 50E, the antenna element is provided not only in the first flat portion 181 but also in the second flat portion 182. In the example of FIG. 11, in the second flat portion 182, a plurality of antenna elements (four in the example in FIG. 11) including an antenna element 191, an antenna element 192, and the like is arranged.

In the example of FIG. 11, the antenna element 191 is connected to the first antenna element 1211 on the first flat portion 181 by the first power supply wiring 141. The antenna element 192 is connected to the second antenna element 1212 on the first flat portion 181 by the second power supply wiring 142. Note that the antenna element provided in the first flat portion 181 and the antenna element provided in the second flat portion 182 need not be connected to each other by the power supply wiring. That is, the power supply wiring connected to the antenna element provided in the first flat portion 181 and the power supply wiring connected to the antenna element provided in the second flat portion 182 may be different from each other.

According to the wiring substrate 50E of the sixth embodiment, since the antenna element is arranged not only in the first flat portion 181 but also in the second flat portion 182, it is possible to radiate radio waves in various directions.

Note that, the example of FIG. 10, in which the hole portion 150 is formed not only in the bent portion 170 but also over the first flat portion 181 and the second flat portion 182 has been described. However, the hole portion 150 of FIG. 10 may be formed in the bent portion 170, and may be formed over one of the first flat portion 181 and the second flat portion 182. Further, the hole portion 150 of FIG. 10 may be formed in the bent portion 170 and may not be formed in both of the first flat portion 181 and the second flat portion 182.

Note that the hole portion 150 may be configured to be formed before the dielectric substrate 130 is bent. With this configuration, after the hole portion 150 is formed in the dielectric substrate 130 in a state in which the bent portion 170 is not formed (for example, the dielectric substrate 130 having a flat shape), the dielectric substrate 130 is bent (the bent portion 170 is formed).

Further, the hole portion 150 may be configured to be formed, after the dielectric substrate 130 is bent, as a result. For example, a slit is formed in the dielectric substrate 130 in which the bent portion 170 is not formed. The slit penetrates in a thickness direction of the dielectric substrate 130 along a part of a contour of the hole portion 150 to be formed. After the slit is formed, by bending the dielectric substrate 130, a part of the dielectric substrate 130 rises from a plane of a bent portion 170 by the slit, and a protruding portion is formed, and the hole portion 150 is formed. Further, the protruding portion may be removed.

Seventh Embodiment

In a seventh embodiment, a configuration for fixing the antenna module more firmly to the housing will be described.

Figure 12:
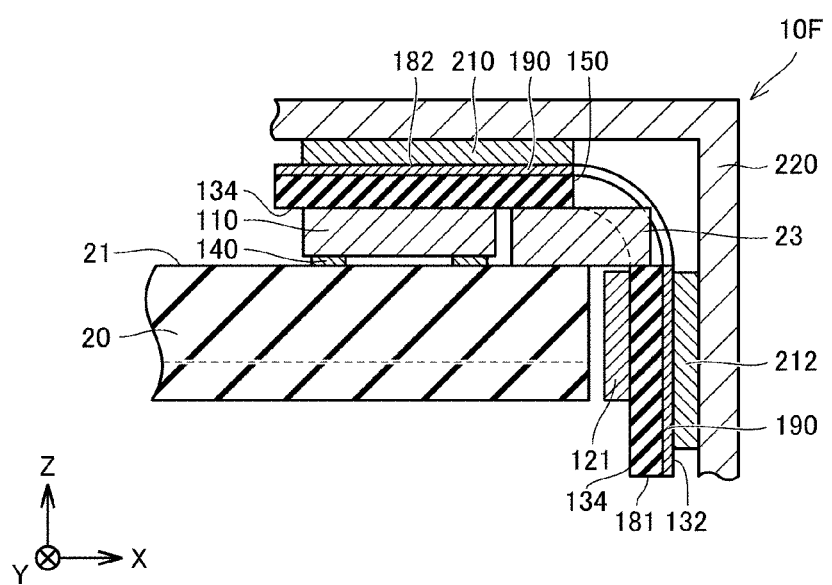
FIG. 12 is a cross-sectional view of a part of a communication device according to a seventh embodiment.

FIG. 12 is a cross-sectional view of a communication device 10F according to the seventh embodiment. In the communication device 10C illustrated in FIG. 8, the configuration in which the antenna element 121 (the first antenna element 1211 and the second antenna element 1212) is formed on the first main surface 132 has been described. On the other hand, in the communication device 10F illustrated in FIG. 12, the antenna element 121 is formed on the second main surface 134. That is, in the seventh embodiment, the antenna element 121 is formed on an inner side of the wiring substrate 50. As described above, in the seventh embodiment, both the antenna element 121 and the RFIC 110 are formed on the inner side of the bent wiring substrate.

Since the antenna element 121 is formed on the inner side of the bent wiring substrate, a space can be provided between the first flat portion 181 and the housing 220. This space is a space in which the antenna element 121 illustrated in FIG. 8 is present. Therefore, in the space, an adhesive layer 212 can be provided on the first main surface 132 of the first flat portion 181. Accordingly, it is possible not only to provide the adhesive layer 210 on the first main surface 132 of the second flat portion 182, but also to provide the adhesive layer 212 on the first main surface 132 of the first flat portion 181. Therefore, the antenna module and the housing 220 can be fixed to each other more firmly by the adhesive layer 212 and the adhesive layer 210.

Figure 13:
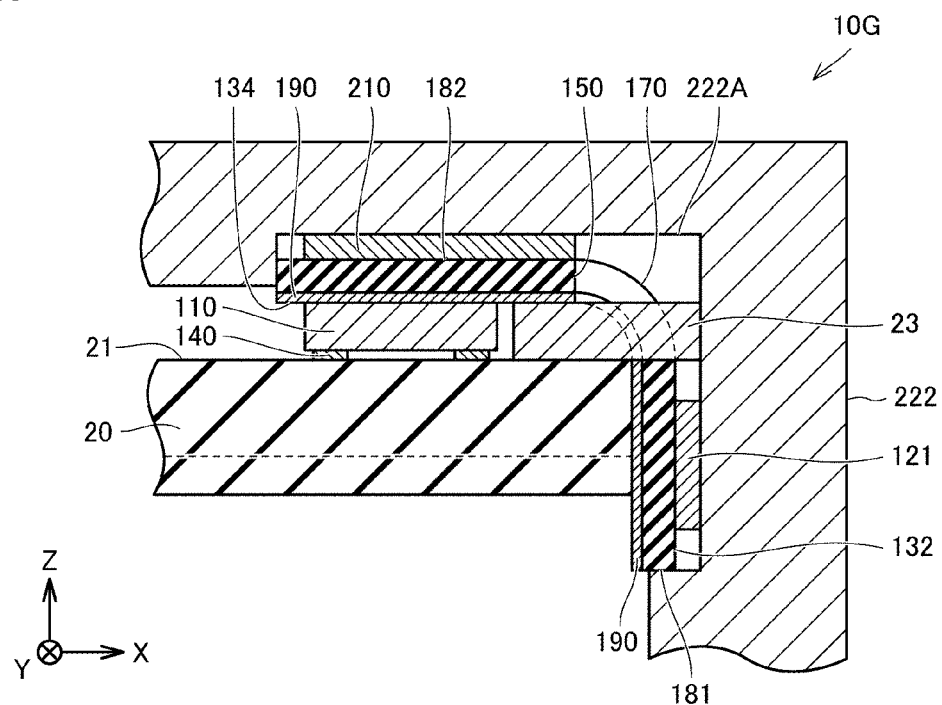
FIG. 13 is a cross-sectional view of a part of a communication device according to another embodiment of the seventh embodiment.

FIG. 13 is a cross-sectional view of a communication device 10G according to another embodiment of the seventh embodiment. In FIG. 13, the housing 220 illustrated in FIG. 8 and FIG. 12 is replaced with a housing 222.

A recessed portion 222A is formed on an inner side of the housing 222. At least a part of the antenna module of the communication device 10G is accommodated in the recessed portion 222A. Further, the antenna module of the communication device 10G is attached to the housing 222 with the adhesive layer 210 interposed therebetween.

According to the communication device 10G according to this embodiment, at least a part of the antenna module of the communication device 10G is accommodated in the recessed portion 222A, and the antenna module is fixed to the housing 222. Therefore, the antenna module of the communication device 10G and the housing 220 can be more firmly fixed to each other.

Note that, FIG. 13 illustrates an example in which the antenna element 121 is arranged on the first main surface 132 of the first flat portion 181. However, as illustrated in FIG. 12, the antenna element 121 may be arranged on the second main surface 134 of the first flat portion 181, and the adhesive layer may be provided in a space in which the antenna element 121 was present.

In addition, in the examples of FIG. 12 and FIG. 13, the convex portion 23 has been described as being provided on the mounting substrate 20. However, although not particularly illustrated, the convex portion 23 may be provided in the housing (the housing 220 or the housing 222). The convex portion 23 is provided so as to protrude from the housing toward the inner side (toward the antenna module). The convex portion 23 is inserted into the hole portion 150. Even in such a configuration, the antenna module can be attached to the housing by the convex portion 23 and the hole portion 150. Alternatively, as a modified example, the convex portion 23 inserted in the hole portion 150 may be provided on both of the mounting substrate 20 and the housing. That is, the convex portion 23 may be provided on at least one of the mounting substrate 20 and the housing.

Modified Example

Thus, the present disclosure is not limited to the above-described embodiments, and various modifications and applications are possible.
(1) In the above-described embodiment, it has been described that the hole portions 150 are provided in all gaps between the adjacent power supply wirings (for example, the first power supply wiring 141 and the second power supply wiring 142). However, a configuration may be adopted in which the hole portion 150 is formed in at least one gap of all the gaps. According to this configuration, the manufacturing cost for forming the hole portion 150 can be reduced as compared to the configuration in which the hole portion 150 is formed in all the gaps.
(2) The wiring substrate according to the above-described embodiment has been described as an example in which the wiring substrate is applied to a so-called patch antenna. However, the wiring substrate may be applied to other types of antennas. Other types of antennas include, for example, a monopole antenna, a dipole antenna, and the like.
(3) In the fourth to sixth embodiments, it has been described that the hole portion 150 is formed in the bent portion 170. However, the hole portion 150 may be formed in a flat portion. The hole portion 150 formed in the flat portion may be used as the positioning of the wiring substrate on the mounting substrate, and the communication device may be formed by inserting the convex portion 23 into the hole portion 150.
(4) In the third embodiment, for example, in a case where the first main surface 132 is viewed in a plan view, the hole portion 150 has been described as having a rectangular shape. However, the hole portion 150 is not limited to a rectangular shape, and may have another shape. The hole portion 150 may be, for example, circular or elliptical. Even in a wiring substrate in which the hole portion 150 having such a shape is formed, the same effects as those in the above-described embodiment are obtained.
(5) In the above-described embodiment, it has been described that the first power supply wiring 141 and the second power supply wiring 142 are formed in the same layer. However, the first power supply wiring 141 and the second power supply wiring 142 may be respectively formed in different layers. Even in such a configuration, by forming the hole portion 150 between the first power supply wiring 141 and the second power supply wiring 142, the degree of the electromagnetic field coupling through the dielectric substrate 130 between the first power supply wiring 141 and the second power supply wiring 142 can be reduced. As a result, it is possible to improve the isolation between the first antenna element 1211 and the second antenna element 1212.
(6) In the embodiment described above, the configuration in which the first power supply wiring 141 and the second power supply wiring 142 are formed on the first main surface 132 has been described. However, the first power supply wiring 141 and the second power supply wiring 142 may be formed inside the dielectric substrate 130. Also, in such a configuration, the hole portion 150 is formed between the first power supply wiring 141 and the second power supply wiring 142. The hole portion 150 makes it possible to reduce the degree of the electromagnetic field coupling through the dielectric substrate 130 between the first power supply wiring 141 and the second power supply wiring 142. As a result, it is possible to improve the isolation between the first antenna element 1211 and the second antenna element 1212.
(7) In the embodiment described above, the configuration in which the RFIC 110 is formed in a layer different from the layer in which the first power supply wiring 141 and the second power supply wiring 142 are formed has been described. However, the RFIC 110 may be formed in the same layer as the layer in which the first power supply wiring 141 and the second power supply wiring 142 are formed. For example, in FIG. 5, the RFIC 110 may be provided on the first main surface 132, and the first power supply wiring 141 and the second power supply wiring 142 may extend from the RFIC 110.

(8) In the example illustrated in FIG. 8 and FIG. 12 of the above-described embodiment, it has been described that the adhesive layer 210 and the adhesive layer 212 are used as an example of means for attaching the antenna module to the housing. However, means for attaching the antenna module to the housing may be other means. The other means may be, for example, a locking claw provided on an inner side of the housing, and the locking claw may be a means for locking at least one of the first flat portion 181 and the second flat portion 182. According to this configuration, since the adhesive layer is not required to be used, it is possible to suppress the influence of the adhesive layer and the like, and as a result, it is possible to improve the communication quality of the communication device. Note that in this configuration, a gap may be provided between the antenna module and the housing, or the gap may not be provided.

(9) In the example of FIG. 5 of the above-described embodiment, it has been described that one power supply wiring is connected to one antenna element. However, one power supply wiring may be connected to the plurality of antenna elements.

Figure 14:
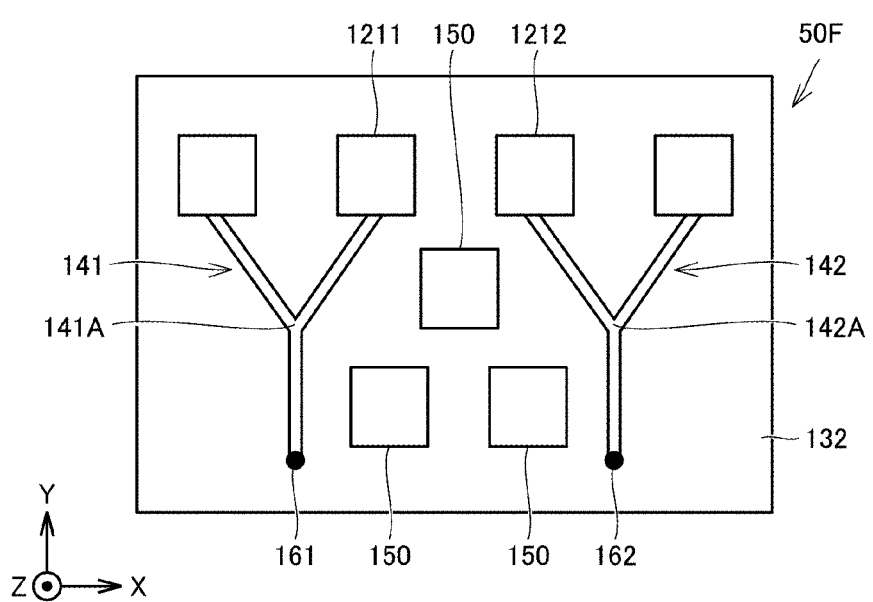
FIG. 14 is a plan view of a wiring substrate according to a modified example.

FIG. 14 is a view when the first main surface 132 of a wiring substrate 50F of the modified example is viewed in a plan view. One end of the first power supply wiring 141 is electrically connected to the via 161. The first power supply wiring 141 is branched into a plurality of branches at a branch portion 141A, and thus a plurality of other ends is formed. In the example of FIG. 14, the first power supply wiring 141 is branched into two at the branch portion 141A, and two other ends are formed. Two other ends of the first power supply wiring 141 are electrically connected to two antenna elements, respectively. The two antenna elements include the first antenna element 1211.

Further, one end of the second power supply wiring 142 is electrically connected to the via 162. The second power supply wiring 142 is branched into a plurality of (two in the example of FIG. 14) branches at a branch portion 142A, and thus a plurality of (two in the example of FIG. 14) other ends is formed. In the example of FIG. 14, the second power supply wiring 142 is branched into two at the branch portion 142A, and two other ends are formed. Two other ends of the second power supply wiring 142 are electrically connected to two antenna elements, respectively. The two antenna elements include the second antenna element 1212. Although not illustrated, a divider is formed in the branch portion 141A and the branch portion 142A, and the impedance before and after the branch is matched.

In the example of FIG. 14, the plurality of hole portions 150 is formed between the first power supply wiring 141 and the second power supply wiring 142 on the first main surface 132. In the example of FIG. 14, three hole portions are formed between the first power supply wiring 141 and the second power supply wiring 142.

Even with the configuration illustrated in FIG. 14, it is possible to reduce the possibility that the electric lines of force between the first power supply wiring 141 and the ground conductor and the electric lines of force between the second power supply wiring 142 and the ground conductor are coupled to each other between the first power supply wiring 141 and the second power supply wiring 142. As a result, it is possible to improve the isolation between the first antenna element 1211 and the second antenna element 1212. Note that the number of the hole portions 150 may be one, may be two, or may be equal to or more than four.

Further, the hole portion 150 may be provided between the wiring of the first power supply wiring 141 from the via 161 to the branch portion 141A and the wiring of the second power supply wiring 142 from the via 162 to the branch portion 142A. In this case, the hole portion 150 is not provided between the wiring of the first power supply wiring 141 from the branch portion 141A to the first antenna element 1211 and the wiring of the second power supply wiring 142 from the branch portion 142A to the second antenna element 1212.

In addition, the hole portion 150 may be provided between the wiring of the first power supply wiring 141 from the branch portion 141A to the first antenna element 1211 and the wiring of the second power supply wiring 142 from the branch portion 142A to the second antenna element 1212. In this case, the hole portion 150 is not provided between the wiring of the first power supply wiring 141 from the via 161 to the branch portion 141A and the wiring of the second power supply wiring 142 from the via 162 to the branch portion 142A.

(10) In the example of FIG. 10, it has been described that a plurality of antenna elements is formed on the same plane. However, also, the antenna element may be formed on each of two planes having different normal directions.

Figure 15:
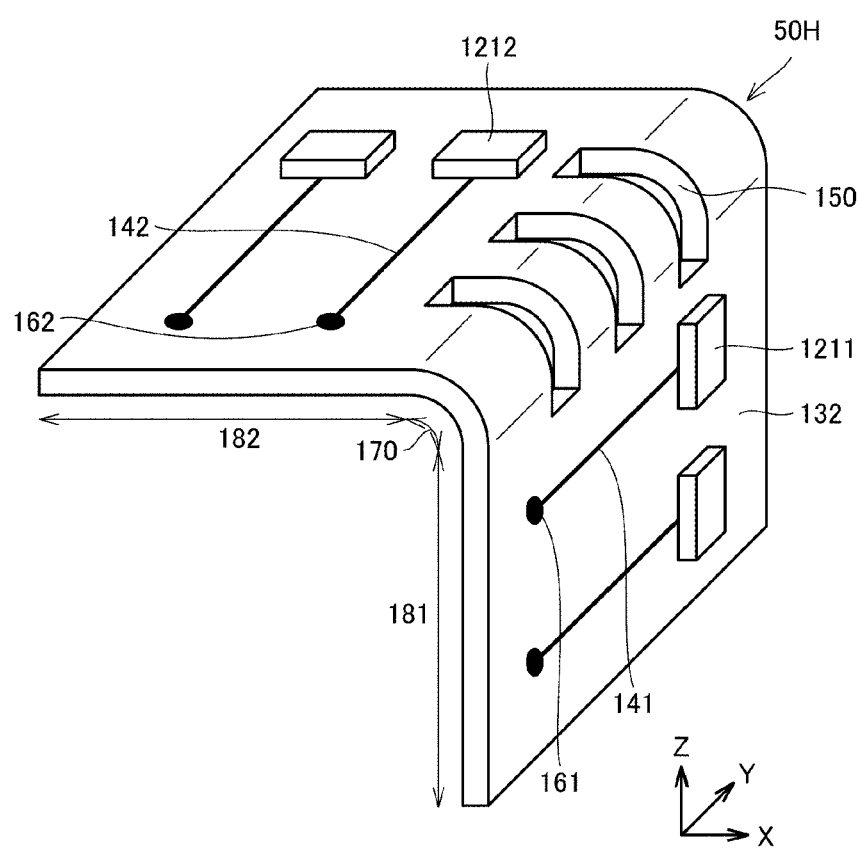
FIG. 15 is a perspective view of the wiring substrate according to the modified example.

FIG. 15 is a perspective view of a wiring substrate 50H according to a modified example. In the example of FIG. 15, a main surface of the first flat portion 181 and a main surface of the second flat portion 182 are different from each other in the normal direction. In the first flat portion 181, a plurality of antenna elements is formed to be arranged along the Z-axis direction. In the example of FIG. 15, two antenna elements are formed to be arranged along the Z-axis direction in the first flat portion 181. The two antenna elements include the first antenna element 1211. In the first flat portion 181, a plurality of vias is formed to be arranged along the Z-axis direction. In the example of FIG. 15, two vias are formed to be arranged along the Z-axis direction in the first flat portion 181. The two vias include the via 161 corresponding to the first antenna element 1211. Further, the first power supply wiring 141 extends in the Y-axis direction. One end of the first power supply wiring 141 is electrically connected to the first antenna element 1211. The other end of the first power supply wiring 141 is connected to the via 161.

In the second flat portion 182, a plurality of antenna elements is formed to be arranged along the X-axis direction. In the example of FIG. 15, two antenna elements are formed to be arranged along the Z-axis direction in the second flat portion 182. The two antenna elements include the second antenna element 1212. In the second flat portion 182, a plurality of vias is formed to be arranged along the X-axis direction. In the example of FIG. 15, two vias are formed to be arranged along the X-axis direction in the second flat portion 182. The two vias include the via 162 corresponding to the second antenna element 1212. Further, the second power supply wiring 142 extends in the Y-axis direction. One end of the second power supply wiring 142 is electrically connected to the second antenna element 1212. The other end of the second power supply wiring 142 is connected to the via 162.

The plurality of hole portions 150 is formed in the first flat portion 181, the second flat portion 182, and the bent portion 170 between the first power supply wiring 141 and the second power supply wiring 142. In addition, the plurality of hole portions 150 is formed to be arranged along the extending direction (i.e., the Y-axis direction) of the first power supply wiring 141 and the second power supply wiring 142. In the example of FIG. 15, three hole portions 150 are formed to be arranged along the extending direction of the first power supply wiring 141 and the second power supply wiring 142.

Even with the configuration illustrated in FIG. 15, in a case where the antenna elements can be formed on planes having different normal directions, it is possible to reduce the possibility that the electric lines of force between the first power supply wiring 141 and the ground conductor and the electric lines of force between the second power supply wiring 142 and the ground conductor are coupled to each other between the first power supply wiring 141 and the second power supply wiring 142. As a result, it is possible to improve the isolation between the first antenna element 1211 and the second antenna element 1212.

Note that, in the example of FIG. 15, the number of the hole portions 150 is three, but the number of the hole portions 150 may be one, may be two, or may be equal to or more than four. Further, in the example of FIG. 15, the hole portion 150 is formed in the first flat portion 181, the second flat portion 182, and the bent portion 170. The hole portion 150 may not be formed in the first flat portion 181 and the second flat portion 182, but may be formed only in the bent portion 170. The hole portion 150 may be formed to extend only from the bent portion 170 to the first flat portion 181. Alternatively, the hole portion 150 may be formed to extend only from the bent portion 170 to the second flat portion 182. That is, the hole portion 150 may be formed over at least one of the first flat portion 181 and the second flat portion 182 and the bent portion 170.

It should be considered that the embodiments disclosed herein are illustrative in all respects and are not intended to be limiting. The scope of the present disclosure is indicated by the scope of claims rather than the description of the above-described embodiments, and it is intended that all modifications within the meaning and scope equivalent to the scope of the claims are included.

10, 10C, 10E COMMUNICATION DEVICE
20 MOUNTING SUBSTRATE
21 MAIN SURFACE
22 SIDE SURFACE
23 CONVEX PORTION
50, 50A, 50B, 50D, 50E, 50F, 50H WIRING SUBSTRATE
100, 100C, 100E ANTENNA MODULE
120 ANTENNA ARRAY
121 ANTENNA ELEMENT
130 DIELECTRIC SUBSTRATE
132 FIRST MAIN SURFACE
134 SECOND MAIN SURFACE
140 BUMP
141 FIRST POWER SUPPLY WIRING
142 SECOND POWER SUPPLY WIRING
141A, 142A BRANCH PORTION
150 HOLE PORTION
152 THROUGH-HOLE PORTION
161, 162 VIA
170 BENT PORTION
180 REFRACTIVE PORTION
181 FIRST FLAT PORTION
182 SECOND FLAT PORTION
190 GROUND CONDUCTOR
210, 212 ADHESIVE LAYER
220 HOUSING
1211 FIRST ANTENNA ELEMENT
1212 SECOND ANTENNA ELEMENT

The invention claimed is:

1. A wiring substrate for supplying radio frequency signals to an antenna module having a first antenna element and a second antenna element, the wiring substrate comprising:
a dielectric substrate having a laminated structure;
a first power supply wiring formed in the dielectric substrate and configured to supply a first radio frequency signal to the first antenna element;
a second power supply wiring formed in the dielectric substrate and configured to supply a second radio frequency signal to the second antenna element; and
a ground conductor formed in a layer that is different from both a first layer in which the first power supply wiring is formed and a second layer in which the second power supply wiring is formed,
wherein a hole portion is formed in the dielectric substrate from a first surface of the dielectric substrate between the first power supply wiring and the second power supply wiring toward the ground conductor, and
wherein the hole portion does not reach the ground conductor.

2. A wiring substrate for supplying radio frequency signals to an antenna module having a first antenna element and a second antenna element, the wiring substrate comprising:
a dielectric substrate having a laminated structure;
a first power supply wiring formed in the dielectric substrate and configured to supply a first radio frequency signal to the first antenna element;
a second power supply wiring formed in the dielectric substrate and configured to supply a second radio frequency signal to the second antenna element; and
a ground conductor formed in a layer that is different from both a first layer in which the first power supply wiring is formed and a second layer in which the second power supply wiring is formed,
wherein a hole portion is formed in the dielectric substrate from a first surface of the dielectric substrate between the first power supply wiring and the second power supply wiring toward the ground conductor,
wherein the hole portion extends from the surface of the dielectric substrate to the ground conductor,
wherein the dielectric substrate has a bent portion in which the first power supply wiring and the second power supply wiring are formed, and
wherein the hole portion is formed in the bent portion.

3. The wiring substrate according to claim 1, wherein the ground conductor is arranged on a second surface of the dielectric substrate.

4. The wiring substrate according to claim 1, wherein when a wave length of the first radio frequency signal is defined as $\lambda$, at least one of a first length of the hole portion in an extending direction of the first power supply wiring and a second length of the hole portion in a direction orthogonal to the extending direction is less than $\lambda/2$.

5. The wiring substrate according to claim 2, wherein when a wave length of the first radio frequency signal is defined as $\lambda$, at least one of a first length of the hole portion in an extending direction of the first power supply wiring and a second length of the hole portion in a direction orthogonal to the extending direction is less than $\lambda/2$.

6. A wiring substrate for supplying radio frequency signals to an antenna module having a first antenna element and a second antenna element, the wiring substrate comprising:
- a dielectric substrate having a laminated structure;
- a first power supply wiring formed in the dielectric substrate and configured to supply a first radio frequency signal to the first antenna element;
- a second power supply wiring formed in the dielectric substrate and configured to supply a second radio frequency signal to the second antenna element; and
- a ground conductor formed in a layer that is different from both a first layer in which the first power supply wiring is formed and a second layer in which the second power supply wiring is formed,
- wherein a hole portion is formed in the dielectric substrate from a first surface of the dielectric substrate between the first power supply wiring and the second power supply wiring toward the ground conductor,
- wherein the dielectric substrate has a bent portion in which the first power supply wiring and the second power supply wiring are formed, and
- wherein the hole portion is formed in the bent portion.

7. The wiring substrate according to claim 2, wherein a through-hole portion communicating with the hole portion is formed in the ground conductor.

8. The wiring substrate according to claim 6,
- wherein the dielectric substrate has a flat portion extending from the bent portion, and
- wherein the hole portion is formed in the bent portion and the flat portion.

9. The wiring substrate according to claim 1, wherein the hole portion is used for positioning on a mounting substrate to which the wiring substrate is attached.

10. The wiring substrate according to claim 2, wherein the hole portion is used for positioning on a mounting substrate to which the wiring substrate is attached.

11. An antenna module comprising:
- the wiring substrate according to claim 1;
- the first antenna element; and
- the second antenna element.

12. An antenna module comprising:
- the wiring substrate according to claim 2;
- the first antenna element; and
- the second antenna element.

13. An antenna module comprising:
- the wiring substrate according to claim 6;
- the first antenna element;
- the second antenna element; and
- a radio frequency circuit that supplies the first radio frequency signal and the second radio frequency signal,
- wherein the dielectric substrate includes:
  - a first flat portion extending from the bent portion; and
  - a second flat portion extending from the bent portion,
- wherein the first antenna element and the second antenna element are arranged in the first flat portion, and
- wherein the radio frequency circuit is arranged in the second flat portion.

14. The antenna module according to claim 13, wherein an antenna element is arranged in the second flat portion.

15. A communication device comprising the antenna module according to claim 11.

16. A communication device comprising the antenna module according to claim 13.

17. A communication device comprising the antenna module according to claim 14.

18. A communication device comprising:
- an antenna module including:
  - the wirng substrate according to claim 9;
  - the first antenna element; and
  - the second antenna element; and
- the mounting substrate having a convex portion that is inserted into the hole portion,
- wherein the wiring substrate is attached to the mounting substrate via the convex portion being inserted into the hole portion.

* * * * *